United States Patent
Goodwin et al.

(10) Patent No.: US 6,293,810 B1
(45) Date of Patent: Sep. 25, 2001

(54) SOCKET FOR BGA PACKAGES

(75) Inventors: Jonathan W. Goodwin, Braintree; Stephen DelPrete, Rehoboth; Steven Wakefield, Allston, all of MA (US)

(73) Assignee: Thomas & Betts International, Inc., Sparks, NV (US)

( * ) Notice: Subject to any disclaimer, the term of this patent is extended or adjusted under 35 U.S.C. 154(b) by 0 days.

(21) Appl. No.: 09/499,772

(22) Filed: Feb. 8, 2000

(51) Int. Cl.$^7$ ............................................. H01R 12/00

(52) U.S. Cl. ............................................. 439/71

(58) Field of Search .................. 439/70, 71, 66

(56) References Cited

U.S. PATENT DOCUMENTS

| | | | |
|---|---|---|---|
| 4,239,312 | * 12/1980 | Myer et al. | 439/69 |
| 5,152,694 | * 10/1992 | Bargain | 439/70 |
| 5,155,905 | * 10/1992 | Miller, Jr. | 439/71 |
| 5,302,853 | * 4/1994 | Volz et al. | 439/71 |
| 5,730,620 | * 3/1998 | Chan et al. | 439/71 |
| 5,738,531 | * 4/1998 | Beaman et al. | 439/71 |
| 5,919,050 | * 7/1999 | Keheley et al. | 439/71 |
| 6,114,757 | * 9/2000 | DelPrete | 439/71 |

* cited by examiner

Primary Examiner—Tulsidas Patel
(74) Attorney, Agent, or Firm—Weingarten, Schurgin, Gagnebin & Hayes LLP

(57) ABSTRACT

A socket for a BGA package is provided which is of relatively simple construction and which provides reliable and efficient interconnection of a BGA package and a printed circuit board. The socket comprises a contact assembly having an array of resilient conductive columns having respective contact ends, the columns being mounted on a thin insulative sheet. The contact assembly is supported on a frame of insulating material and which has alignment posts for alignment of the contact assembly to the frame and for alignment of the frame and mounted contact assembly to an associated circuit board. The frame also includes latch elements for retaining the contact assembly on the frame. The socket is mounted onto a printed circuit board which has an array of contact areas corresponding to the array of resilient contacts of the socket. A BGA package is placed onto the socket frame and the package is maintained in alignment on the frame such that the ball contacts engage the respective contacts of the contact assembly of the socket. The package is retained in the socket by a retention mechanism. The socket can include elements for preventing overstress of the resilient contacts.

11 Claims, 6 Drawing Sheets

SOCKET FOR BGA PACKAGES

CROSS REFERENCE TO RELATED APPLICATIONS

N/A

STATEMENT REGARDING FEDERALLY SPONSORED RESEARCH OR DEVELOPMENT

BACKGROUND OF THE INVENTION

One well known form of electronic package is the ball grid array (BGA) package in which an electronic circuit, typically an integrated circuit, is contained within a thin rectangular housing having an array of ball shaped electrical contacts on a surface of the package. Such a package is typically mounted to a corresponding array of contact areas of a printed circuit board. Since the BGA package is soldered directly to a circuit board, the package is not removable from the board without unsoldering. Sockets are known for removably mounting electronic circuit packages onto printed circuit boards; however, sockets for BGA packages have not heretofore been successfully implemented. Test sockets are known for testing BGA packages but such test sockets are generally complex and relatively large and cumbersome and are impractical for use in usual circuit board environments.

BRIEF SUMMARY OF THE INVENTION

In accordance with the present invention, a socket for a BGA package is provided which is of relatively simple construction and which provides reliable and efficient interconnection of a BGA package and a printed circuit board. The socket comprises a contact assembly having an array of resilient conductive columns having respective contact ends, the columns being mounted on a thin insulative sheet. The contact assembly is supported on a frame of insulating material and which has alignment posts for alignment of the contact assembly to the frame and for alignment of the frame and mounted contact assembly to an associated circuit board. The frame also includes latch elements for retaining the contact assembly on the frame.

For use, the socket is mounted onto a printed circuit board which has an array of contact areas corresponding to the array of resilient contacts of the socket. A BGA package is placed onto the socket frame and the package is maintained in alignment on the frame such that the ball contacts engage the respective contacts of the contact assembly of the socket. The package is retained in the socket by a retention mechanism. The socket can include elements for preventing overstress of the resilient contacts.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
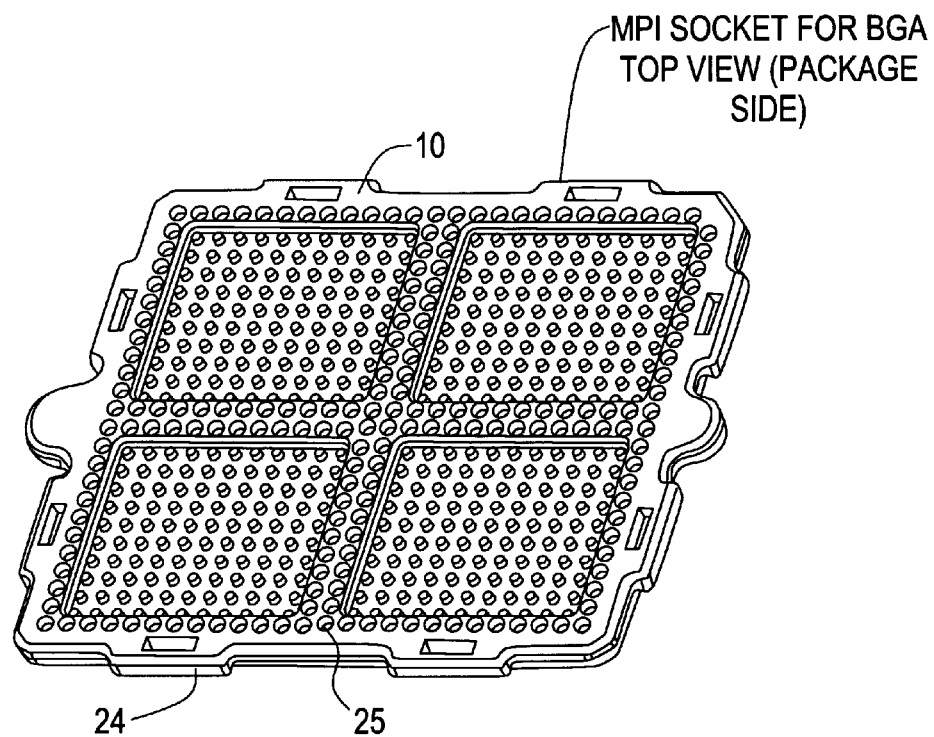
FIG. 1 is a pictorial top view of a socket in accordance with the invention.
Figure 2:
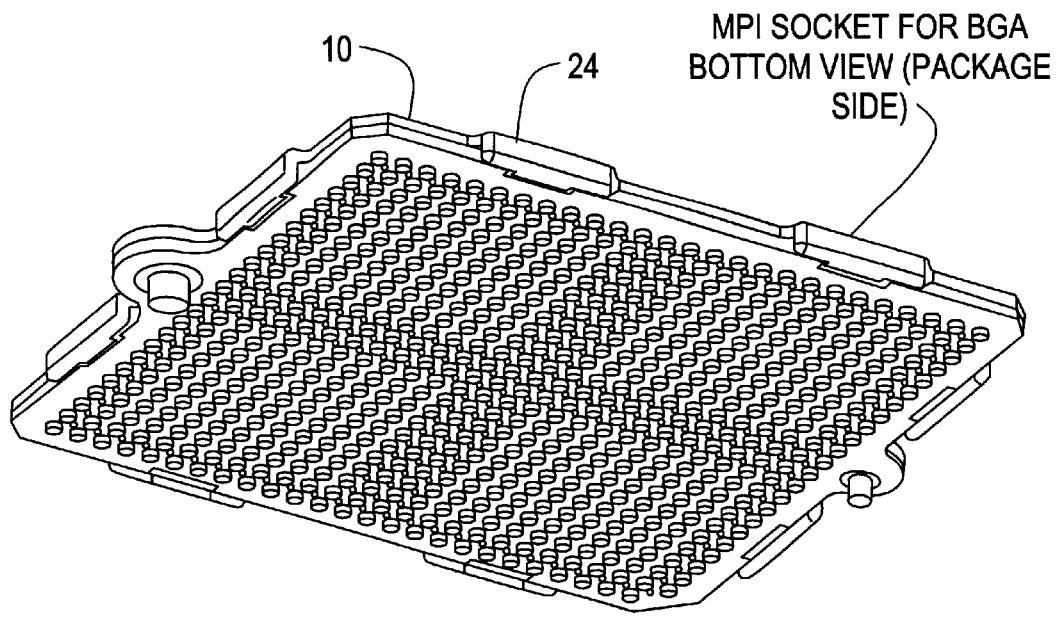
FIG. 2 is a bottom pictorial view of the socket of FIG. 1.
Figure 3:
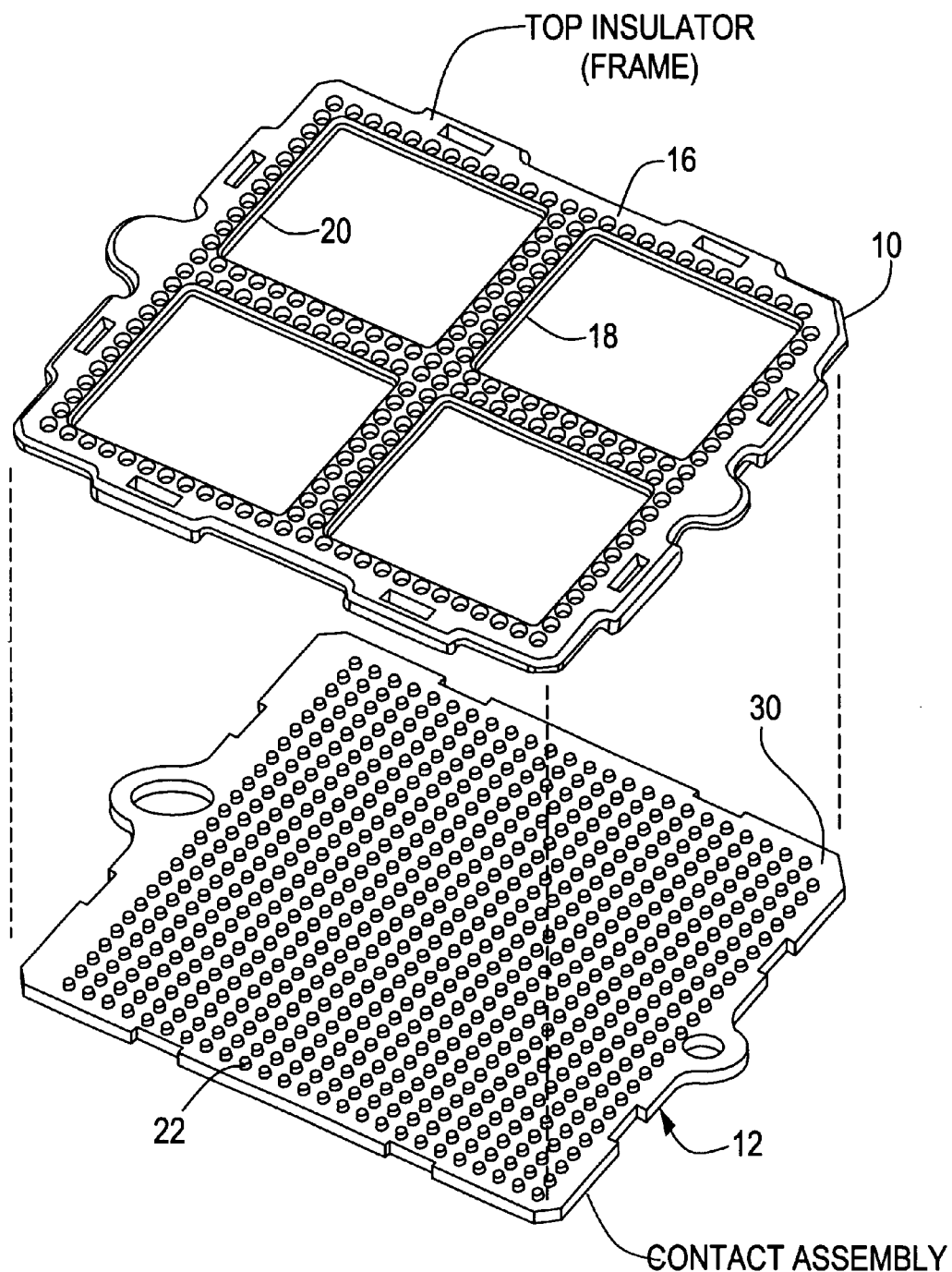
FIG. 3 is an exploded view illustrating the frame and contact assembly of the socket of FIGS. 1 and 2.
Figure 4:
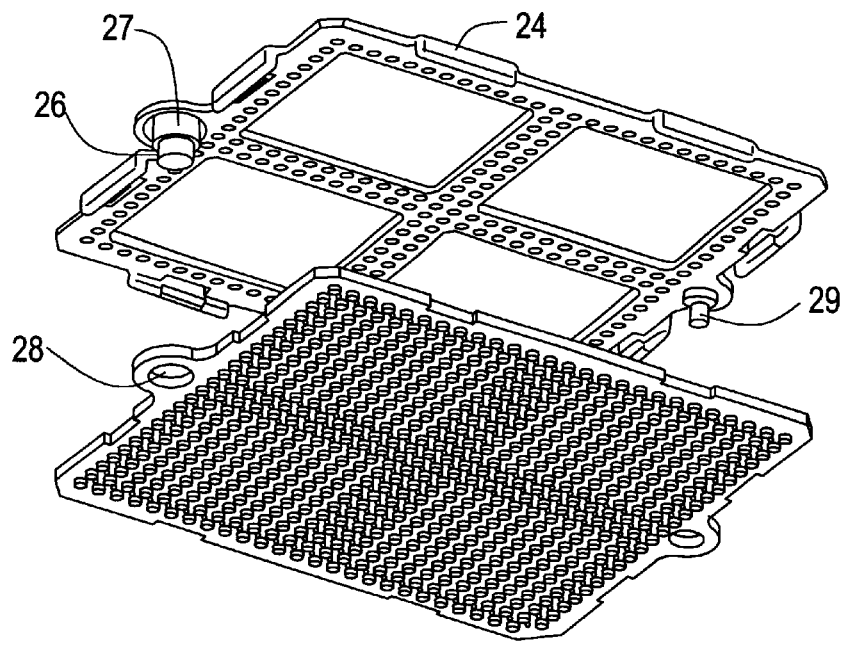
FIG. 4 is another exploded view of the frame and contact assembly.
Figure 5:
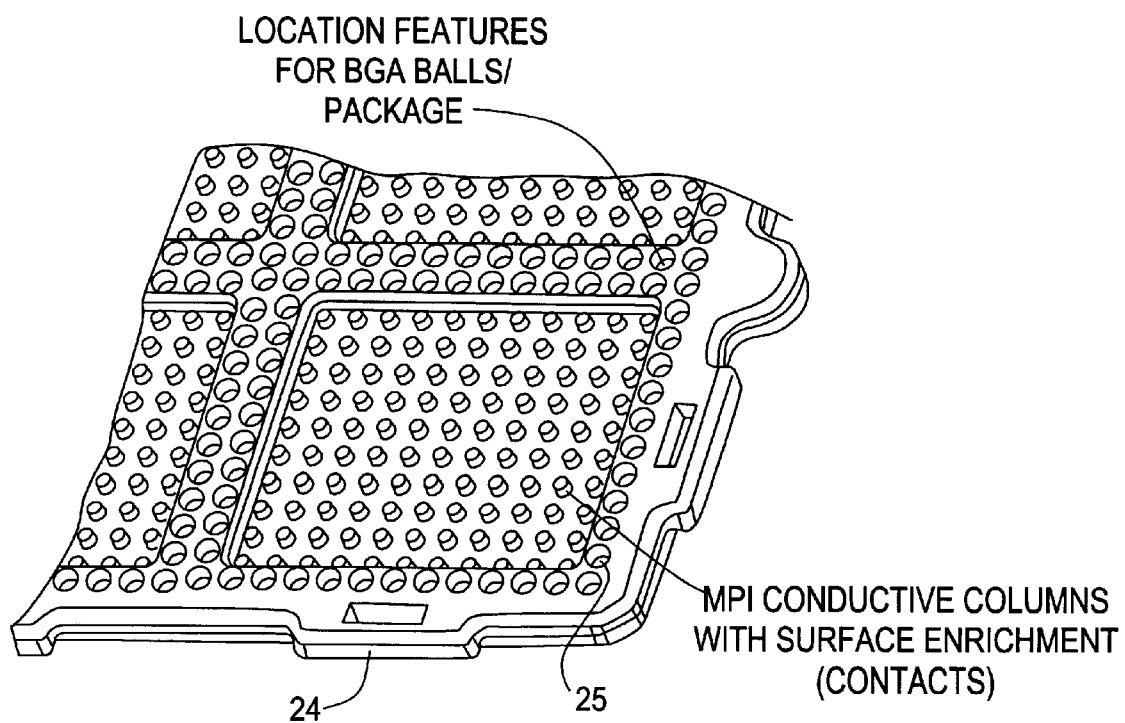
FIG. 5 is an enlarged cutaway pictorial view of the socket of the invention.
Figure 6:
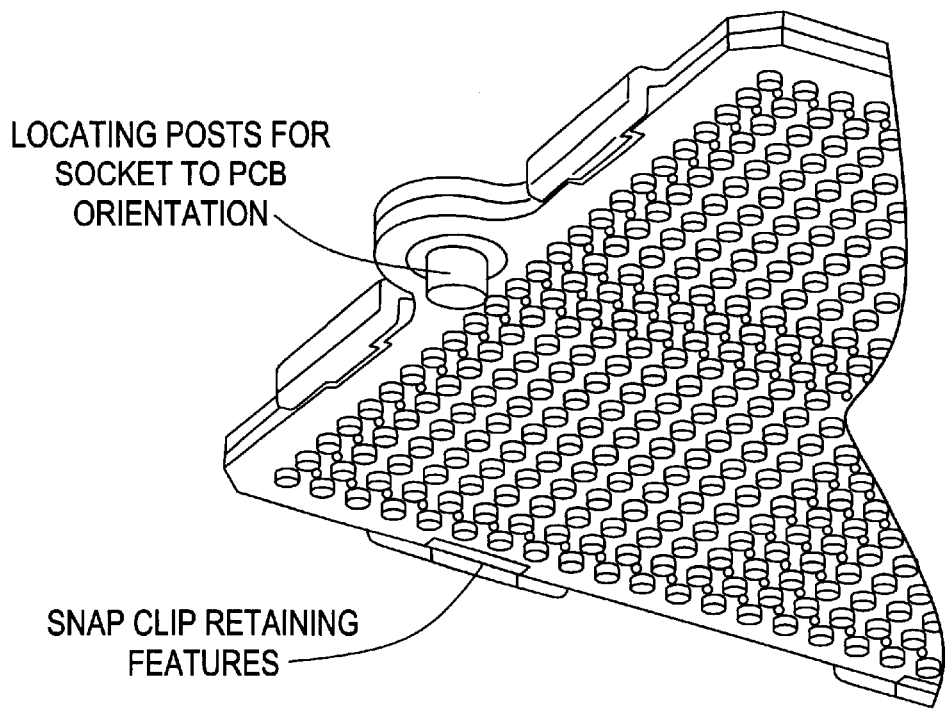
FIG. 6 is an enlarged bottom pictorial view partially cutaway of the embodiment of FIG. 6.

Referring to the drawings there is shown a socket for a BGA package which includes an insulator frame 10 and a contact assembly 12 retained in the frame. The contact assembly is adapted to be disposed on a printed circuit board and to be retained thereon by the insulator frame and a retention mechanism. A BGA package 14 (FIG. 7) is disposed on the insulator frame and is retained therein for electrical contact via the contact assembly to contacts on the circuit board. The socket 11 in relation to a circuit board 13 is shown in FIG. 8.

The insulator frame 10 is of square or rectangular configuration in the illustrated embodiment and having a peripheral portion 16 and cross members 18 which contain an array of openings 20 which correspond to the configuration of contacts 22 on the contact assembly 12. The insulator frame also includes a plurality of snap clips 24 spaced about the periphery of the frame and locating posts 26 on respective sides of the frame. The locating posts are cooperative with respective openings 28 in the contact assembly and are also cooperative with openings in the circuit board to which the socket is mounted for alignment of the socket to the circuit board. The locating posts have two different diameters as illustrated to provide proper orientation of the contact assembly on the frame and circuit board. The location posts 26 each have a first diameter 27 sized to which are stepped to locate the contact assembly 12 to the insulator frame 10, and a smaller diameter 29 to locate the socket to the printed circuit board.

The contact assembly 12 is comprised of an insulating sheet 30 having an array of resilient conductive columns 32 disposed in respective openings through the sheet and having upper and lower contact ends. The conductive columns are preferably as shown in copending application Ser. No. 09/222,137, filed Dec. 29, 1998, assigned to the same assignee as this invention. The contact assembly also includes stop posts 34 disposed between columns 32 to limit the amount of compression of the resilient conductive columns when the socket is mounted on a circuit board.

Figure 7:
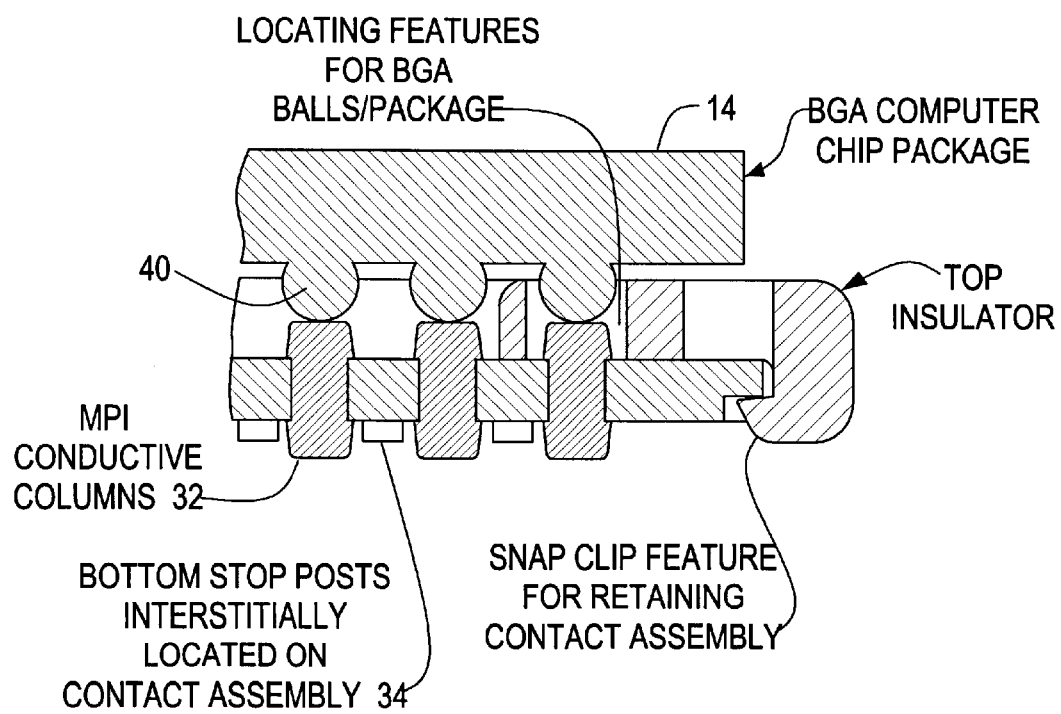
FIG. 7 is an enlarged cross-sectional view illustrating a BGA package mounted on the socket.
Figure 8:
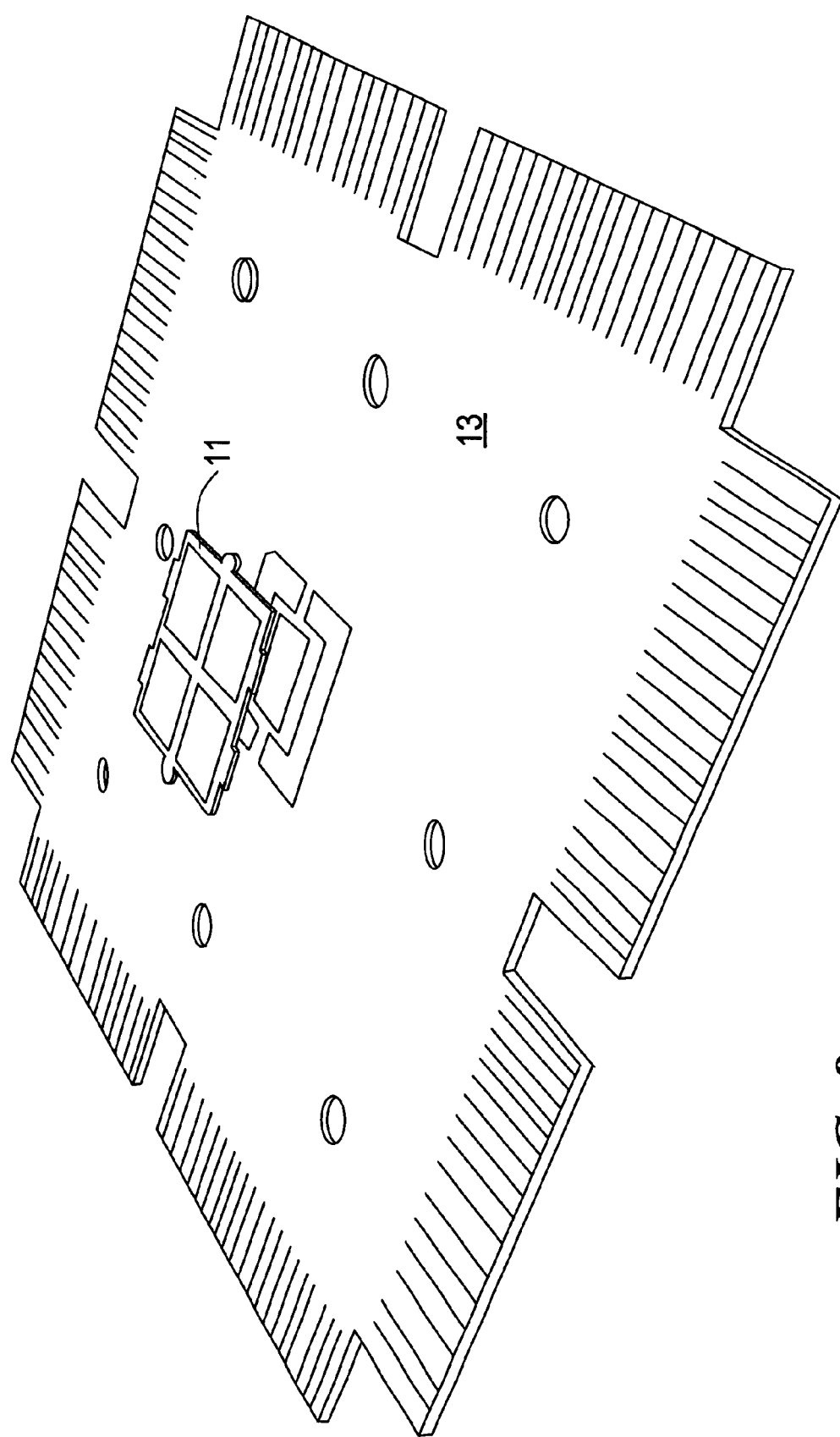
FIG. 8 is an exploded view of the socket of the invention and associated circuit board.

As shown in FIG. 7, the BGA package 14 is disposed in the socket with the ball contacts 40 in engagement with the contact ends of the contact assembly 12. Some of the ball contacts are disposed in openings 25 in the frame 10 which serve to align the ball contacts with the contact ends of the contact assembly 12. The ball contacts 40 of the BGA package each contact a respective contact end 32 of a conductive column of the contact assembly. The bottom contact ends 32 of the conductive columns engage respective contacts on the circuit board.

Figure 9:
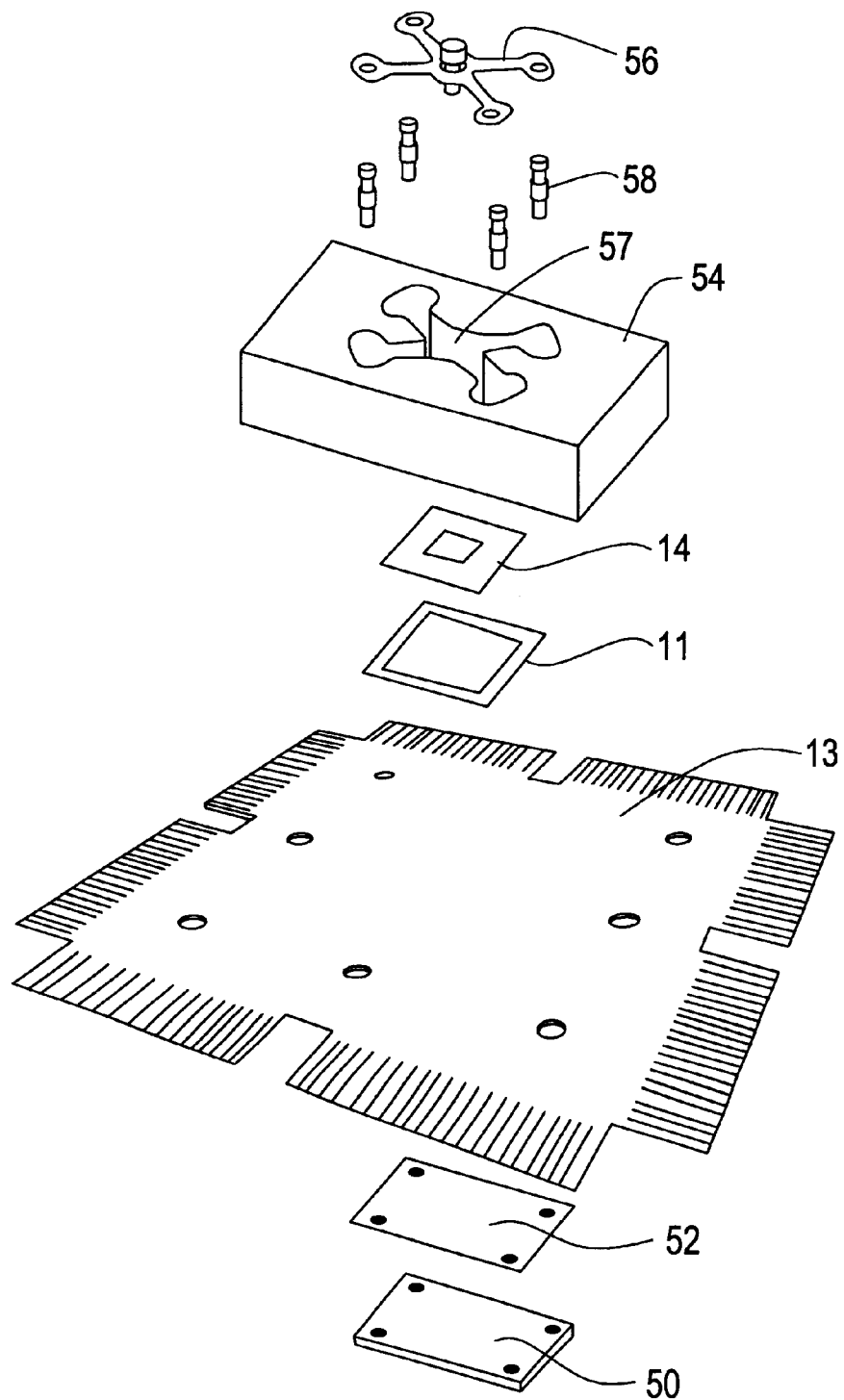
FIG. 9 is an exploded view of a clamp mechanism employed with the socket of the invention.

The socket and BGA package are retained on a circuit board, in a preferred embodiment as shown in FIG. 9. The socket 11 is disposed on a circuit board 13 and retained in position by alignment or locating posts on the socket and cooperative openings on the circuit board as described above. A backing plate 50 is of generally rigid material such as steel and is disposed on the backside of the circuit board and insulated therefrom by an insulator plate 52. A heat sink 54 is disposed over the package 14 and the assembly is retained by a multi-beam spring 56 which fits in opening 57, and threaded fasteners 58 which are cooperative with threaded openings in the backing plate 50 to clamp the components together. This clamp mechanism is itself the subject of copending application Ser. No. 09/330,402 filed Jun. 11, 1999 and assigned to the Assignee of this invention. Other clamp or retention mechanisms may be employed to retain the socket and its circuit package on an associated circuit board.

The invention should not be limited by what has been particularly shown and described but is to embrace the spirit and full scope of the appended claims.

What is claimed is:

1. A socket for a BGA package comprising:

a contact assembly having an array of resilient conductive columns having respective contact ends and an insulative sheet on which the conductive columns are mounted; and a frame of insulating material having first elements for alignment of the frame to the contact assembly, second elements for alignment of the socket to an associated circuit board, and third elements for alignment of the BGA package on the socket, the frame including, a peripheral portion having the third elements composed of an array of openings which correspond to the configuration of the contact ends on the contact assembly, and at least one cross member extending between sections of the peripheral portion and which have the third elements composed of an array of openings which correspond to the configuration of the contact ends on the contact assembly.

2. The socket of claim 1 wherein the frame includes snap clips spaced about the periphery thereof and operative to retain the insulative sheet of the contact assembly on the frame.

3. The socket of claim 1 wherein the first elements include locating posts having a section of first diameter cooperative with openings in the contact assembly for retention of the contact assembly in alignment on the frame.

4. The socket of claim 3 wherein the second elements include locating posts having a section of second diameter cooperative with respective openings in the associated circuit board for retaining the socket in aligned position on the circuit board.

5. The socket of claim 1 wherein the second elements include locating posts having portions of two different diameters, first portions of first diameter cooperative with respective openings in the contact assembly and second portions of second diameter being cooperative with respective openings in the associated circuit board.

6. The socket of claim 1 wherein the contact assembly includes the insulative sheet having an array of openings in which the resilient conductive columns are respectively disposed.

7. The socket of claim 1 wherein the insulative sheet of the contact assembly includes stop posts disposed between selected resilient conductive columns and operative to limit the amount of compression of the resilient conductive columns when the socket is mounted on the circuit board.

8. The socket of claim 1 wherein the third elements are openings in at least a portion of the frame which contains the contact ends of the contact assembly and which are operative to align the BGA package on the socket.

9. A socket for a BGA package comprising:

a contact assembly having an array of resilient conductive columns having respective contact ends, an insulative sheet on which the conductive columns are mounted, and first and second alignment guides; and a frame of insulating material having first elements for alignment with said first alignment guides of said contact assembly to align the frame to the contact assembly, second elements for alignment with said second alignment guides of said contact assembly to align the socket to an associated circuit board, and third elements for alignment of the BGA package on the socket;

wherein the first elements include locating posts having a section of first diameter cooperative with openings corresponding to said first alignment guides in the contact assembly for retention of the contact assembly in alignment on the frame.

10. The socket of claim 9 wherein the second elements include locating posts having a section of second diameter cooperative with respective openings in the associated circuit board for retaining the socket in aligned position on the circuit board.

11. A socket for a BGA package comprising:

a contact assembly having an array of resilient conductive columns having respective contact ends, an insulative sheet on which the conductive columns are mounted, and first and second alignment guides; and a frame of insulating material having first elements for alignment with said first alignment guides of said contact assembly to align the frame to the contact assembly, second elements for alignment with said second alignment guides of said contact assembly to align the socket to an associated circuit board, and third elements for alignment of the BGA package on the socket;

wherein the insulative sheet of the contact assembly includes stop posts disposed between selected resilient conductive columns and operative to limit the amount of compression of the resilient conductive columns when the socket is mounted on the circuit board.

* * * * *